(12) United States Patent
Burgener, II et al.

(10) Patent No.: US 7,935,616 B2
(45) Date of Patent: May 3, 2011

(54) DYNAMIC P-N JUNCTION GROWTH

(76) Inventors: Robert H. Burgener, II, Murray, UT (US); Roger L. Felix, Pleasant Grove, UT (US); Gary M. Renlund, Salt Lake City, UT (US)

( * ) Notice: Subject to any disclaimer, the term of this patent is extended or adjusted under 35 U.S.C. 154(b) by 751 days.

(21) Appl. No.: 11/165,847

(22) Filed: Jun. 17, 2005

(65) Prior Publication Data
US 2005/0285119 A1    Dec. 29, 2005

Related U.S. Application Data

(60) Provisional application No. 60/580,454, filed on Jun. 17, 2004.

(51) Int. Cl.
*H01L 21/00* (2006.01)
(52) U.S. Cl. ...................................... 438/506
(58) Field of Classification Search .................. None
See application file for complete search history.

(56) References Cited

U.S. PATENT DOCUMENTS

| | | | |
|---|---|---|---|
| 3,664,867 A | 5/1972 | Galli et al. | |
| 3,864,725 A | 2/1975 | Merrin | |
| 4,288,801 A * | 9/1981 | Ronen | 257/393 |
| 4,399,441 A | 8/1983 | Vaughn et al. | |
| 5,065,200 A * | 11/1991 | Bhat et al. | 257/15 |
| 5,148,958 A * | 9/1992 | Eskandari et al. | 228/3.1 |
| 5,279,724 A * | 1/1994 | Rauch et al. | 204/298.09 |
| 5,322,606 A * | 6/1994 | Eskandari | 204/298.28 |
| 5,331,655 A | 7/1994 | Harder et al. | |
| 5,679,965 A * | 10/1997 | Schetzina | 257/103 |
| 5,858,818 A * | 1/1999 | Ro et al. | 438/133 |
| 6,057,561 A | 5/2000 | Kayasaki et al. | |
| 6,291,085 B1 | 9/2001 | White et al. | |
| 6,299,438 B1 * | 10/2001 | Sahagian et al. | 433/6 |
| 6,342,313 B1 | 1/2002 | White et al. | |
| 6,407,405 B1 * | 6/2002 | Sano et al. | 257/15 |
| 6,410,162 B1 | 6/2002 | White et al. | |
| 6,475,825 B2 | 11/2002 | White et al. | |
| 6,527,858 B1 * | 3/2003 | Yoshida et al. | 117/108 |
| 6,589,362 B2 | 7/2003 | Haga | |
| 6,610,141 B2 | 8/2003 | White et al. | |

(Continued)

FOREIGN PATENT DOCUMENTS

EP     1219731 A1     7/2002

(Continued)

OTHER PUBLICATIONS

Aulbur, W.; Density Functional Theory: Basic Ideas & Applications; Ohio State University.

(Continued)

*Primary Examiner* — David E Graybill
(74) *Attorney, Agent, or Firm* — Kirton & McConkie; Evan R. Witt

(57) ABSTRACT

Methods of fabricating semiconductor p-n junctions and semiconductor devices containing p-n junctions are disclosed in which the p-n junctions contain concentration profiles for the p-type and n-type dopants that are controllable and independent of a dopant diffusion profile. The p-n junction is disposed between a layer of semiconductor doped with a p-type dopant and a layer of semiconductor doped with an n-type dopant. The p-n junction is fabricated using a crystal growth process that allows dynamic control and variation of both p-type and n-type dopant concentrations during the crystal growth process.

9 Claims, 8 Drawing Sheets

U.S. PATENT DOCUMENTS

| | | | |
|---|---|---|---|
| 6,617,183 B2* | 9/2003 | Kadota et al. | 438/22 |
| 6,624,441 B2 | 9/2003 | Cantwell et al. | |
| 6,664,565 B1 | 12/2003 | Sano et al. | |
| 6,673,478 B2* | 1/2004 | Kato et al. | 428/698 |
| 6,707,074 B2 | 3/2004 | Yoshii et al. | |
| 6,733,895 B2* | 5/2004 | Kadota et al. | 428/469 |
| 6,838,308 B2 | 1/2005 | Haga | |
| 7,141,489 B2* | 11/2006 | Burgener et al. | 438/478 |
| 7,161,173 B2* | 1/2007 | Burgener et al. | 257/43 |
| 7,172,813 B2* | 2/2007 | Burgener et al. | 428/446 |
| 7,208,387 B2* | 4/2007 | Yamada et al. | 438/343 |
| 7,227,196 B2* | 6/2007 | Burgener et al. | 257/103 |
| 2003/0226499 A1 | 12/2003 | Teherani | |
| 2004/0061114 A1 | 4/2004 | Yan et al. | |
| 2004/0094085 A1* | 5/2004 | White et al. | 117/4 |
| 2004/0099876 A1 | 5/2004 | Niki et al. | |
| 2004/0108505 A1* | 6/2004 | Tuller et al. | 257/76 |
| 2004/0166681 A1* | 8/2004 | Iles et al. | 438/689 |
| 2004/0175860 A1 | 9/2004 | Park et al. | |
| 2005/0009223 A1* | 1/2005 | Ishizaki | 438/47 |
| 2005/0285119 A1* | 12/2005 | Burgener et al. | 257/79 |
| 2005/0285138 A1* | 12/2005 | Burgener et al. | 257/189 |
| 2006/0001044 A1* | 1/2006 | Yamada et al. | 257/197 |
| 2006/0233969 A1* | 10/2006 | White et al. | 427/576 |
| 2006/0255367 A1* | 11/2006 | Yamada et al. | 257/197 |

FOREIGN PATENT DOCUMENTS

| | | |
|---|---|---|
| JP | 2002068890 | 3/2002 |

OTHER PUBLICATIONS

Look, D.C., and Claflin, B.; P-type doping and devices based on ZnO; Aug. 2003; Wiley-VCH Verlag GmbH & Co.

Zunger, A.; Practical Doping Principles; NCPV and Solar Program Review Meeting 2003; pp. 831-835.

Zhang, S.B., Wei, S.H., and Zunger, A.; Intrinsic $n$-type versus $p$-type doping asymmetry and the defect physics of ZnO; Physical Review B; Jan. 31, 2001; pp. 075205-1-075205-7; vol. 63; The American Physical Society.

Limpijumnong, S., Zhang, S.B., Wei, S-H., and Park C.H; Doping by Large-Size-Mismatched Impurities: The Microscopic Origin of Arsenic- or Antimony-Doped $p$-Type Zinc Oxide; Physical Review Letters; Apr. 16, 2004; vol. 92, No. 15; The American Physical Society.

Yamamoto, T., and Katayama-Yoshida, H.; Solution Using a Codoping Method to *Unipolarity* for the Fabrication of $p$-Type ZnO; Japanese Journal of Applied Physics; Feb. 15, 1999; pp. L 166-L 169; vol. 38; Japanese Journal of Applied Physics Publication Board.

Park, C.H., Zhang, S.B., and Wei, S-H.; Origin of $p$-type doping difficulty in ZnO: The impurity perspective; Physical Review B; Aug. 5, 2002; pp. 073202-1-073202-3; vol. 66; The American Physical Society.

Tsukazaki, A., Atsushi, T. Ohtomo, A., Onuma, T., Ohtani, M., Makino, T., et al; Repeated temperature modulation epitaxy for p-type doping and light-emitting diode based on ZnO; Nature Materials; Jan. 2005; pp. 42-46; vol. 4; Nature Publishing Group.

Nonaka, M., Matsushima, S., Mizuno, M., and Kobayashi, K.; Electronic Structure of Group III Elements Dopes into ZnO by Using Molecular Orbital Calculation; Chemistry Letters 2002; Feb. 20, 2002; pp. 580-581; The Chemical Society of Japan.

Wang, L.G., and Zunger, A.; Cluster-Doping Approach for Wide-Gap Semiconductors: The Case of $p$-type ZnO; Physical Review Letters; Jun. 27, 2003; pp. 256401-1-256401-4; vol. 90, No. 25; The American Physical Society.

Norton, D.P., Heo, Y.W., Ivill, M.P., Ip, K., Pearton, S.J., et al; ZnO: growth, doping and processing; Materialstoday; Jun. 2004; Elsevier Ltd.

Lee, E-C., Kim, Y.-S., Jin, Y.-G., and Chang, K.J.; First-Principles Study of $p$-Type Doping and Codoping in ZnO; Journal of the Korean Physical Society; Dec. 2001; pp. S23-S26; vol. 39.

Morhain, C., Teisseire, M., Vezian, S., Vigue, F., Raymond, F., et al; Spectroscopy of Excitons, Bound Excitons and Impurities in h-ZnO Epilayers; Sep. 30, 2001; pp. 881-885; vol. 229, No. 2; Wiley VCH; Berlin.

Bandyopadhyay, S., Paul, G.K., Roy, R., Sen, S.K., and Sen, S; Study of structural and electrical properties of grain-boundary modified ZnO films prepared by sol-gel technique; Materials Chemistry and Physics; May 17, 2001; pp. 83-91; vol. 74; Elsevier Science B.V.

Wilkinson, J., Xiong, G., Ucer, K.B., and Williams, R.T.; Lifetime and Oscillator Strength of Excitonic Luminescence in Zinc Oxide; Department of Physics, Wake Forest University, Winston-Salem, NC.

Kobayashi, A., Sankey, O.F., and Dow, J.D.; Deep energy levels of defects in the wurtzite semiconductors AlN, CdS, CdSe, and ZnO: Physical Review B; Jul. 15, 1983; pp. 946-956; vol. 28, No. 2; The American Physical Society.

Daneu, N., Reenik, A., and Bernik, S. Grain Growth Control in $Sb_2O_3$-Doped Zinc Oxide; Journal of the American Ceramic Society; 2003; pp. 1379-1384; vol. 86, No. 8.

Ohyama, M.; Sol-Gel Preparation of Transparent and Conductive Aluminum-Doped Zinc Oxide Films with Highly Preferential Crystal Orientation; Journal of the American Ceramic Society; 1998; pp. 1622-1632; vol. 81, No. 6.

Duan, X.L., Yuan, D.R., Cheng, X.F., Sun, H.Q., Sun, Z.H., et al; Microstructure and Properties of $Co^2$: $ZnAl_2O_4/SiO_2$ Nanocomposite Glasses Prepared by Sol-Gel Method; Journal of the American Ceramic Society; 2005; pp. 399-403; vol. 88, No. 2.

Sohn, K.S., Hwang, D.K., and Myoung, J.M.; Time Integrated/Resolved Photoluminescense of ZnO Films Deposited on Sapphire and GaAs; Japanese Journal of Applied Physics; Dec. 2003; pp. 7376-7378; The Japan Society of Applied Physics.

Sun, X.W.; Optical properties of epitaxially grown zinc oxide films on sapphire by pulsed laser deposition; Journal of Applied Physics; Jul. 1, 1999; pp. 408-411; vol. 86, No. 1; American Institute of Physics.

Burden, A.P., Bishop, H.E., Brierley, M., Friday, J.M., Hood, C., et al.; Incorporating consumer-priced field emitting inks into arrays of triode devices; Solid State Electronics; 2001; pp. 987-996; vol. 45; Printable Field Emitters Ltd.

Minami, T., Miyata, T., Shirai, T., and Nakatani, T.; Electroluminescent Oxide Phosphor Thin Films Prepared by a Sol-gel Process; Mat. Res. Soc. Symp. Proc.; 2000; pp. Q4.3.1-Q4.3.6; vol. 621; Materials Research Society.

Qiu, C., Chen, H., Wong, M., and Kwok, H.S.; Dependence of the Current and Power Efficiencies of Organic Light-Emitting Diode on the Thickness of the Constituent Organic Layers; IEEE Transactions on Electron Devices; Sep. 2001; pp. 2131-2137; vol. 48; IEEE.

Matsuda, T., Kawabe, M., Iwata, H., and Ohzone, T.; Visible Electroluminescence from MOS Capacitors with Si-Implanted $SiO_2$; IEICE Trans. Electron.; Sep. 11, 2002; pp. 1895-1904; vol. E85-C, No. 11.

Ong, H.C., Li, A.S.K., and Du, G.T.; Depth profiling of ZnO thin films by cathodoluminescence; Applied Physics Letters; Apr. 30, 2001; pp. 2667-2669; vol. 78, No. 18; American Institute of Physics.

Washington, P.L., Ong, H.C., Dai, J.Y., and Chang, R.P.H.; Determination of the optical constants of zinc oxide thin films by spectroscopic ellipsometry; Applied Physics Letter; Jun. 22, 1998; pp. 3261-3263; vol. 72, No. 25; American Institute of Physics.

Sekiguchi, T., Ohashi, N., and Yamane, H.; Cathodoluminescence Study on ZnO and GaN; Solid State Phenomena; 1998; pp. 171-182; vols. 63-64; Scitec Publications; Switzerland.

Kouyate, D., Ronfard-Haret, J.-C., and Kossanyi, J.; Photo- and electro-luminescence of rare earth-doped semiconducting zinc oxide electrodes: Emission from both the dopant and the support; Journal of Luminescence; 1991; pp. 205-210; vol. 50; Elsevier Science Publishers B.V.

Kossanyi, J., Kouyate, D., Pouliquen, J., Ronfard-Haret, J.C., Valat, P., et al.; Photoluminescence of Semiconducting Zinc Oxide Containing Rare Earth Ions as Impurities; Journal of Luminescence; 1990; pp. 17-24; vol. 46; Elsevier Science Publishers B.V. (north-Holland).

Wang, Y.G., Lau, S.P., Lee, H.W., Yu, S.F., Tay, B.K., et al.; Photoluminescence study of ZnO films prepared by thermal oxidation of Zn metallic films in air; Journal of Applied Physics; Jul. 1, 2003; pp. 354-358; vol. 94, No. 1; American Institute of Physics.

Yu, S.F., Yuen, C., Lau, S.P., Wang, Y.G., Lee, H.W., et al.; Ultraviolet amplified spontaneous emission from zinc oxide ridge waveguides on silicon substrate; Applied Physics Letter; Nov. 24, 2003; pp. 4288-4290; vol. 83, No. 21; American Institute of Physics.

Xiong, G., Wilkinson, J., Lyles, J., Ucer, K.B., and Williams, R.T.; Luminescence and stimulated emission in zinc oxide nanoparticles, films, and crystals.

Ong, H.C., Dai, J.Y., and Du, G.T.; Studies of electronic structure of ZnO grain boundary and its proximity by using spatially resolved electron energy loss spectroscopy; Applied Physics Letter; Jul. 8, 2002; pp. 277-279; vol. 81, No. 2; American Institute of Physics.

Agne, T., Guan, Z., Li, X.M., Wolf, H., and Wichert, T.; Incorporation of the Donor Indium in Nanocrystalline ZnO; phys. stat. sol.; 2002; pp. 819-823; vol. 229; Wiley-VCH Verlag Berlin GmbH; Berlin.

Qadri, S.B., Kim, H., Horwitz, J.S., and Chrisey, D.B.; Transparent conducting films of $ZnO$-$ZrO_2$: Structure and properties; Journal of Applied Physics; Dec. 1, 2000; pp. 6564-6566; vol. 88, No. 11; American Institute of Physics.

Han, J., Mantas, P.Q., and Senos, A.M.R.; Grain growth in Mn-doped ZnO; Journal of the European Ceramic Society; 2000; 2753-2758; vol. 20.

Jin, Y., Zhang, B. Yang, S., Wang, Y., Chen, J., et al.; Room temperature UV emission of $Mg_xZn_{1-x}O$ films; Solid State Communications; 2001; pp. 409-413; vol. 119; Elsevier Science Ltd.

Petrik, N. G., Alexandrov, A.B., and Vall, A.I.; Interfacial Energy Transfer during Gamma Radiolysis of Water on the Surface of $ZrO_2$ and Some Other Oxides; J. Phys. Chem. B; 2001; pp. 5935-5944; vol. 105; American Chemical Society.

Counio, G., Esnouf, S., Gacoin, T., and Boilot, J.-P.; CdS:Mn Nanocrystals in Transparent Xerogel Matrices: Synthesis and Luminescence Properties; J. Phys. Chem.; 1996; pp. 20021-20026; vol. 100; American Chemical Society.

Stravrev, K., Kynev, K., St. Nikolov, G., and Dyakovitch, V.A.; Semiempirical Assignment of the Electron Transitions in Manganese(II)-Doped II-VI Compounds; J. Phys. Chem. Solids; 1987; pp. 841-844; vol. 48, No. 9; Pergamon Journals Ltd.

Falcony, C., Ortiz, A., Dominguez, J.M., Farias, M.H., Cota-Araiza, L. et al.; Luminescent Characteristics of Tb Doped $Al_2O_3$ Films Deposited by Spray Pyrolysis; J. Electrochem Soc.; Jan. 1992; pp. 267-271; vol. 139, No. 1; The Electrochemical Society, Inc.

Bachir, S., Kossanyi, J., Sandouly, C., Valat, P., and Ronfard-Haret, J. C.; Electroluminescence of $Dy^{3+}$ and $Sm^{3+}$ Ions in Polycrystalline Semiconducting Zinc Oxide; J. r Phys. Chem; 1995; pp. 5674-5679; vol. 99; American Chemical Society.

Bachir, S., Kossanyi, J., and Ronfard-Haret, J.C.; Electroluminescence of $Ho^{3+}$ Ions in a ZnO Varistor-Type Structure; Solid State Communications; 1993; pp. 859-863; vol. 89, No. 10; Elsevier Science Ltd.; Great Britain.

Chakrabarti, S., Ganguli, D., Chaudhuri, S., and Pal, A.K.; Crystalline magnesium oxide films on soda lime glass by sol-gel processing; Meterials Letters; May 2002; pp. 120-123; vol. 54; Elsevier Science B.V.

Arkles, B.; Commercial Applications of Sol-Gel-Derived Hybrid Materials; MRS Bulletin; May 2001; pp. 402-407.

Murray, C.E., Noyan, I.C., and Mooney, P.M.; Mapping of strain fields about thin film structures using x-ray microdiffraction; Applied Physics Letters; Nov. 17, 2003; pp. 4163-4165; vol. 83, No. 20; American Institute of Physics.

Modena, S., Soraru, G.D., Blum, Y., and Raj, R.; Passive Oxidation of an Effluent System: The Case of Polymer-Derived SiCO; Journal of the American Ceramic Society; 2005; pp. 339-345; vol. 88.

Noyan, I.C. Wang, P.-C., Kaldor, S.K., and Jordan-Sweet, J.L.; Deformation field in single-crystal fields semiconductor substrates caused by metallization features; Applied Physics Letters; Apr. 19, 1999; pp. 2352-2354; vol. 74, No. 16; American Institute of Physics.

Noyan, I.C., Jordan-Sweet, J., Liniger, E.G., and Kaldor, S.K.; Characterization of substrate-thin-film interfaces with x-ray microdiffraction; Applied Physics Letters; Jun. 22, 1998; pp. 3338-3340; vol. 72, No. 25; American Institute of Physics.

Tuller, H.L.; ZnO Grain Boundaries: Electrical Activity and Diffusion; Journal of Electroceramics; 1999; pp. 33-40; vol. 4:S1; Kluwer Academic Publishers; Boston.

Westin, G., Ekstrand, A., Nygren, M., Osterlund, R., and Merkelbach, P.; Preparation of ZnO-based Varistors y the Sol-Gel Technique; J. Mater. Chem.; 1994; pp. 615-621; vol. 4.

Wang, M. Yang, X., and Wang., F.; Properties of Sensitive Materials Mainly Composed of ZnO; J. Mater. Sci. Technol.; 2000; p. 204; vol. 16, No. 2.

Baptista, J.L., and Mantas, P.Q.; High Temperature Characterization of Electrical Barriers in ZnO Varistors; Journal of Electroceramics; 2000; pp. 215-224; vol. 4:1; Kluwer Academic Publishers; The Netherlands.

Brankovic, Z., Brankovic, G., Poleti, D., and Varela, J.A.; Structural and electrical properties of ZnO varistors containing different spinel phases; Ceramics International; 2001; pp. 115-122; vol. 27; Elsevier Science Ltd. and Techna S.r.l.

Tanaka, A., and Mukae, K.; Evaluation of Single Grain Boundaries in ZnO: Rare-Earth Varistor by Micro-Electrodes; Key Engineering Materials; 1999; pp. 235-240; vols. 157-158; Trans Tech Publications, Switzerland; CSJ Series-Publications of the Ceramic Society of Japan vol. 1, The Ceramic Society of Japan.

Pandey, R., Jaffe, J.E., and Kunz, A.B., *Ab initio* band-structure calculations for alkaline-earth oxides and sulfides; Physical Review B; Apr. 15, 1991; pp. 9228-9237; vol. 43, No. 11; The American Physical Society.

Canney, S.A., Sashin, V.A., Ford, M.J., and Kheifets, A.S.; Electronic band structure of magnesium and magnesium oxide: experiment and theory; J. Phys. Condens. Matter; 1999; pp. 7507-7522; vol. 11; IOP Publishing Ltd.

Yamasaki, A., and Fujiwara, T.; Electronic structure of the *MO* oxides (M=Mg, Ca, Ti, V) in the GW approximation; Physical Review B; 2002; pp. 245108-1-245108-9; vol. 66; The American Physical Society.

Mikajlo, E.A., Sashin, V.A:, Nixon, K.L., Seoule De Bas, B., Dorsett, H.E., and Ford, M.J.; Band Structures of the Group I and II Oxides: Using EMS Measurements as a Test of Theoretical Models.

Johnson, P.D.; Some Optical Properties of MgO in the Vacuum Ultraviolet; Physical Review; May 15, 1954; pp. 845-846; vol. 94, No. 4.

Narazaki, A., Tanaka, K., Hirao, K., Hashimoto, T., Nasu, H., et al.; IR and XPS Studies on the Surface Structure of Poled $ZnO$-$TeO_2$ Glasses with Second-Order Nonlinearity; Journal of the American Ceramic Society; 2001; pp. 214-217; vol. 84.

Schonberger, U., and Aryasetiawan, F.; Bulk and surface electronic structures of MgO; Physical Review B; Sep. 15, 1995; pp. 8788-8793; vol. 52, No. 12; The American Physical Society.

Gonzalez, R., Chen, Y., Sebek, R.M., Williams, G.P., Williams, R.T., et al.; Properties of the 800-nm luminescence band in neutron-irradiated magnesium oxide crystals; Physical Review B; Mar. 1, 1991; pp. 5228-5233; vol. 43, No. 7; The American Physical Society.

Balzer, B., Hagemeister, M., Kocher, P., and Ludwig, J.G.; Mechanical Strength and Microstructure of Zinc Oxide Varistor Ceramics; Journal of the American Ceramic Society; 2004; pp. 1932-1938; vol. 87.

Sheng, H., Emanetoglu, N. W., Muthukumar, S., Yakshinskiy, B.V., Feng, S., et al.; Ta/Au Ohmic Contacts to n_type ZnO; Journal of Electronic Materials; 2003; p. 935; vol. 32, No. 9.

Sheng, H., Emanetoglu, N.W., Muthukumar, S., Feng, S., and Lu, L.; Nonalloyed Al Ohmic Contacts to $Mg_xZn_{12x}O$; Journal of Electronic Materials; 2002; p. 811; vol. 31, No. 7.

Xiong, G., Wilkinson, J., Mischuck, B., Tuzemen, S., Ucer, K.B., et al; Control of p- and n-type conductivity in sputter deposition of undoped ZnO; Applied Physics Letters; Feb. 18, 2002; p. 1195; vol. 80, No. 7.

Yamamoto, T., and Katayama-Yoshida, H.; Unipolarity of ZnO with a wide-band gap and its solution using codoping method; Journal of Crystal Growth; 2000; pp. 552-555; vol. 214/215; Elsevier Science B.V.

Chang, R., Marks, T., Mason, T., and Poeppelmeir, K.; *n/p*-Type Transparent Conductors; pp. 259-260.

Olorunyolemi, T., Birnboim, A., Carmel, Y., Wilson, O.C., Lloyd, I.K.; Thermal Conductivity of Zinc Oxide: From Green to Sintered State; Journal of the American Ceramic Society; 2002; pp. 1249-1253; vol. 85.

Martin, L.P., and Rosen, M.; Correlation between Surface Area Reduction and Ultrasonic Velocity in Sintered Zinc Oxide Powders; Journal of the American Ceramic Society; 1997; pp. 839-846; vol. 80.

Wilkinson, J., Xiong, G., Ucer, K.B., and Williams, R.T.; Lifetime and Oscillator Strength of Excitonic Luminescence in Zinc Oxide.

Sekiguchi, T., Haga, K., and Inaba, K.; ZnO films grown under the oxygen-rich condition; Journal of Crystal Growth; 2000; pp. 68-71; vol. 214-215; Elsevier Science B.V.

Van De Walle, C.G.; Hydrogen as a Cause of Doping in Zinc Oxide; Physical Review Letters; Jul. 31, 2000; pp. 1012-1015; vol. 85, No. 5; The American Physical Society.

Kato, H., Sano, M., Miyamoto, K., and Yao, T.; Effect of O/Zn on Flux Ratio on Crystalline Quality of ZnO Films Grown by Plasma-Assisted Molecular Beam Epitaxy; Japanese Journal of Applied Physics; 2003; pp. 2241-2244; vol. 42; The Japan Society of Applied Physics.

Nakahara, K., Tanabe, T., Takasu, H., Fons, P., Iwata, K., et al.; Growth of undoped ZnO Films with Improved Electrical Properties by Radical Source Molecular Beam Epitaxy; Japanese Journal of Applied Physics; 2001; pp. 250-254; vol. 40; The Japan Society of Applied Physics.

Wang, X., Du, G., Gu, C., Jia, J., Li, X., et al.; Two-step growth of ZnO thin films on diamond/Si low-pressure metal-organic chemical vapour deposition; J. Phys. D: Appl. Phys.; 2002; pp. L74-L76; vol. 35; IOP Publishing Ltd., United Kingdom.

Han, J., Mantas, P.Q., and Senos, A.M.R.; Grain growth in Mn-doped ZnO; Journal of the European Seramic Society; 2000; pp. 2753-2758; vol. 20; Elsevier Science Ltd.

Fons, P., Iwata, K., Niki, S., Yamada, A., Matsubara, K., et al.; Uniaxial locked growth of high-quality epitaxial ZnO films on (1 1 2 0)$\alpha$-$Al_2O_3$; Journal of Crystal Growth; 2000; pp. 532-536; vol. 209; Elsevier Science B.V.

Haga, K., Kamidaira, M., Kashiwaba, Y., Sekiguchi, T., Watanabe, H.; ZnO thin films prepared by remote plasma-enhanced CVD method; Journal of Crystal Growth; 2000; pp. 77-80; vol. 214/215; Elsevier Science B.V.

Fons, P., Iwata, K., Niki, S., Yamada, A., and Matsubara, K.; Growth of high-quality epitaxial ZnO films on $\alpha$-$Al_2O_3$; Journal of Crystal Growth; 1999; pp. 627-632; vol. 201/202; Elsevier Science B.V.

Myoung, J-M., Yoon, W-H., Lee, D-H., Yun, I., Bae, S-H., et al.; Effects of Thickness Variation of Properties of ZnO Thin Films Grown by Pulsed Laser Deposition; Japanese Journal of Applied Physics; 2002; pp. 28-31; vol. 41; The Japan Society of Applied Physics.

Yuldashev, S.U., Panin, G.N., Choi, S.W., Yalishev, V.S., Nosova, L.A., et al.; Electrical and Optical Properties of ZnO Films Grown on GaAs Substrates; Jpn. J. Appl. Phys; 2003; pp. 3333-3336; vol. 42; The Japan Society of Applied Physics.

Nonaka, M., Matsushima, S., Mizuno, M. Kobayashi, K.; Electronic Structure of Group III Elements Doped into ZnO by Using Molecular Orbital Calculation; Chemistry Letters; 2002; pp. 580-581; The Chemical Society of Japan.

Lin, G-R., and Wang, S-C.; Comparison of High-Resistivity ZnO Films Sputtered on Different Substrates; Japanese Journal of Applied Physics; 2002; pp. L398-L401; vol. 41; The Japan Society of Applied Physics.

Mantas, P.Q., and Baptista, J.L.; The Barrier Height Formation in ZnO Varistors; Journal of the European Ceramic Society; 1995; pp. 605-615; vol. 15; Elsevier Science Limited, Great Britain.

Albertsson, J., and Abrahams, S.C.; Atomic Displacement, Anharmonic Thermal Vibration, Expansivity and Pyroelectric Coefficient Thermal Dependences in ZnO; Acta Cryst.; 1989; pp. 34-40; vol. B45; International Union of Crystallography.

Blevins, J.D.; Wide Bandgap Semiconductor Substrates: Current Status and Future Trends.

Teke, A., Ozgur, U., Dogan, S., Gu, X., Morkoc, H., et al.; Excitonic fine structure and recombination dynamics in single-crystalline ZnO; Physical Review B; 2004; pp. 195207-1-195207-10; vol. 70; The American Physical Society.

Look, D.C., Reynolds, D.C., Litton, C.W., Jones, R.L., Eason, D.B., et al.; Characterization of homoepitaxial p-type ZnO grown by molecular beam epitaxy; Applied Physics Letters; Sep. 2, 2002; pp. 1830-1832; vol. 81, No. 10; American Institute of Physics.

Kim, K-K., Kim, H-S., Hwang, D-K., Lim, J-H., and Park, S-J.; Realization of p-type ZnO thin films via phosphorus doping and thermal activation of the dopant; Applied Physics Letters; Jul. 7, 2003; pp. 63-65; vol. 83, No. 1; American Institute of Physics.

Look, D.C.; Emerging Research Fonts Comments by David C. Look; ISI Essential Science Indicators; Apr. 28, 2005.

Senger, R.T., and Bajai, K.K.; Binding energies of excitons in polar quantum well heterostructures; Physical Review B; 2003; pp. 205314-1-205314-9; vol. 68; The American Physical Society.

Subramanyam, T.K., Naidu, B., and Uthanna, S.; Structure and Optical Properties of dc Reactive Magnetron Sputtered Zinc Oxide Films; Cryst. Res. Technol.; 1999; pp. 981-988; vol. 34.

Muth, J.F., Brown, J.D., Johnson, M.A.L., Yu, Z., Kolbas, R.M., et al.; Absorption coefficient and refractive index of GaN, AlN and AlGaN alloys; 1999; MRS Internet J. Nitride Semicond.

Yoshikawa, H., and Adachi, S.; Optical Constants of ZnO; Japanese Journal of Applied Physics; 1997; pp. 6237-6243; vol. 36.

Springer, J., Poruba, A., Vanecek, M., Fay, S., Feitknecht, L., et al.; Improved optical model for thin film silicon solar cells; Presented at $17^{th}$ European Photovoltaic Solar Energy Conference, Munich 2001.

Neethling, J.H., Scriven, G.J., and Krekels, T.; A TEM investigation of $Zn_3As_2$ grown on (001) and (111) InP by MOVPE; Journal of Materials Science; 2001; pp. 3997-4002; vol. 36; Kluwer Academic Publishers.

Brink, D.J., and Engelbrecht, A.A.; Ellipsometric investigation of rough zinc arsenide epilayers; Applied Optics; Apr. 1, 2002; pp. 1894-1898; vol. 41, No. 10; Optical Society of America.

Scriven, G.J., Leitch, A.W.R., Neethling, J.H., Kozyrkov, V.V., and Watters, V.J.; The growth of $Zn_3As_2$ on InP by atmospheric pressure MOVPE; Journal of Crystal Growth; 1997; pp. 813-816; vol. 170; Elsevier Science B.V.

Engelbrecht, J.A.A., Scriven, G.J., Neethling, J.H., and Wagener, M.C.; Crack formation in $Zn_3As_2$ epilayers grown by MOVPE; Journal of Crystal Growth; 2000; pp. 235-244; vol. 216; Elsevier Science B.V.

Norman, A.G., Olson, J.M., Romero, M.J., and Al-Jassim, M.M.; Electron Microscopy Studies of Potential 1-eV Bandgap Semiconductor Compounds $AnGeAs_2$ and $Zn_3As_2$ Grown by MOVPE; National Renewable Energy Laboratory.

Miles, G.C., and West, A.R.; Polymorphism and Thermodynamic Stability of $Zn_7Ab_2O_{12}$; Journal of the American Ceramic Society; 2005; pp. 396-398; vol. 88.

Tomlins, G.W., Routbort, J.L., and Mason, T.O.; Oxygen Diffusion in Single-Crystal Zinc Oxide; Journal of the American Ceramic Society; 1998; pp. 869-876; vol. 81.

Botha, J.R., Scriven, G.J., Engelbrecth, J.A.A., and Leitch, A.W.R.; Photoluminescence properties of metalorganic vapor phase epitaxial $Zn_3As_2$; Journal of Applied Physics; Nov. 15, 1999; pp. 5614-5618; vol. 86, No. 10; American Institute of Physics.

Xiong, G., Wilkinson, J., Mischuck, B., Tuzemen, S., Ucer, K.B., et al.; Control of p-and n-type conductivity in sputter deposition of undoped ZnO; Applied Physics Letters; Feb. 18, 2002; pp. 1195-1197; vol. 80, No. 7; American Institute of Physics.

Look, D.C., Renlund, G.M., Burgener, II, R.H., and Sizelove, J.R.; As-doped p-type ZnO produced by an evaporation/sputtering process; Applied Physics Letters; Nov. 2004; vol. 85.

Aoki, T., Shimizu, Y., Miyake, A., Nakamura, A., Nakanishi, Y., and Hatanaka, Y.; p-Type ZnO Layer Formation by Excimer Laser Doping; phys. stat. sol.; 2002; pp. 911-914; vol. 229, No. 2; WILEY-Vch Verlag Berlin GmbH, Berlin.

Lee, J-M., Kim, K.K., Park, S-J., and Choi, W.K.; Low-resistance and non-alloyed ohmic contacts to plasma treated ZnO; Applied Physics Letters; Jun. 11, 2001; pp. 3842-2844; vol. 78, No. 24; American Institute of Physics.

Yamamoto, T.; Codoping Method to Realize Low-Resistivity p-type ZnO Thin Films; Asia Display/IDW '01, Oct. 16-19, 2001, Nagoya, Oct. 18, PH1-2.

Wang, L.G., and Zunger, A.; Cluster-Doping Approach for Wide-Gap Semiconductors: The Case of p-type ZnO; Physical Review Letters; Jun. 27, 2003; pp. 256401-1-256401-4; vol. 90, No. 25; The American Physical Society.

Nakahara, K., Takasu, H., Fons, P., Yamada, A., Iwata, K., et al.; Growth of N-doped and Ga+N-codoped ZnO films by radical source molecular beam epitaxy; Journal of Crystal Growth; 2002; pp. 503-508; vol. 237-239; Elsevier Science B.V.

Recnik, A., Daneu, N., Walther, T., and Mader, W.; Structure and Chemistry of Basal-Plane Inversion Boundaries in Antimony Oxide-Doped Zinc Oxide; Journal of the American Ceramic Society; 2001; pp. 2357-2668; vol. 84.

Nonaka, M., Matsushima, S., Mizuno, M. and Kobayashi, K.; Electronic Structure of Group III Elements Doped into ZnO by Using Molecular Orbital Calculation; Chemistry Letters; 2002; pp. 580-581; The Chemical Society of Japan.

Ryu, Y.R., Kim, W.J., and White, H.W.; Fabrication of homostructural ZnO p-n junctions; Journal of Crystal Growth; 2000; pp. 419-422; vol. 219; Elsevier Science B.V.

Lu, J., Ye, Z., Wang, L., Huang, J., and Zhao, B.; Structural, electrical and optical properties of N-doped ZnO films synthesized by SS-CVD; Materials Science in Semiconductor Processing; 2003; pp. 491-496; vol. 5; Elsevier Science Ltd.

Zhenguo, J., Kun, L., Chengxing, Y., Ruixin, F., and Zhizhen, Y.; Structural, optical and electrical properties of ZnO thin films prepared by reactive deposition; Journal of Crystal Growth; 2003; pp. 246-251; vol. 253; Elsevier Science B.V.

Ji, Z., Yang, C., Liu, K., and Ye, Z.; Fabrication and characterization of p-type ZnO films by pyrolysis of zinc-acetate—ammonia solution; Journal of Crystal Growth; 2003; pp. 239-242; vol. 253; Elsevier Science B.V.

Ye, Z-Z., Lu, J-G., Chen, H-H., Zhang, Y-Z., Wang, L., et al.; Preparation and characteristics of p-type ZnO films by DC reactive magnetron sputtering; Journal of Crystal Growth; 2003; pp. 258-264; vol. 253; Elsevier Science B.V.

Minegishi, K., Koiwai, Y., Kikuchi, Y., Yano, K., Kasuga, M., et al.; Growth of p-type Zinc Oxide Films by Chemical Vapor Deposition; Japanese Journal of Applied Physics; 1997; pp. L 1453-L 1455; vol. 36.

Joseph, M., Tabata, H., and Kawai, T.; p-Type Electrical Conduction in ZnO Thin Films by Ga and N Codoping; Japanese Journal of Applied Physics; 1999; pp. L 1205-L 1207; vol. 38; Publication Board, Japanese Journal of Applied Physics.

Ashrafi, A.B.M.A., Suemune, I., Kumano, H., and Tanaka, S.; Nitrogen-Doped p-Type ZnO Layers Prepared with $H_2O$ Vapor-Assisted Metalorganic Molecular-Beam Epitaxy; Japanese Journal of Applied Physics; 2002; pp. L 1281-L 1284; vol. 41; The Japan Society of Applied Physics.

The Promise of Solid State Lighting for General Illumination: Light Emitting Diodes (LEDs) and Organic Light Emitting Diodes (OLEDs); 2001; pp. 1-29; Optoelectronics Industry Development Association, Washington, D.C.

Talbot, D.; LEDs vs. the Light Bulb; Technology Review; May 2003; pp. 30-36.

Johnson, S.; LEDs—An Overview of the State of the Art in Technology and Application; Light Right 5 Conference, May 27-31, 2002, Nice, France.

Tuzemen, S., Xiong, G., Wilkinson, J., Mischick, B., Ucer, K.B., et al.; Production and properties of p-n junctions in reactively sputtered ZnO; Physica B; 2001; pp. 1197-1200; vol. 308-310; Elsevier Science B.V.

Guo, X-L., Choi, J-H., Tabata, H., and Kawai, T.; Fabrication and Optoelectronic Properties of a Transparent ZnO Homostructural Light-Emitting Diode; Japanese Journal of Applied Physics; 2001; pp. L 177-L 180; vol. 40; The Japan Society of Applied Physics.

Jadwisienczak, W.M., Lozykowski, H.J., Xu, A., and Patel, B.; Visible Emission from ZnO Doped with Rare-Earth Ions; Journal of Electronic Materials; 2002; pp. 776-784; vol. 31.

Xiong, G., Wilkinson, J., Tuzemen, S., Ucer, K.B., and Williams, R.T.; Toward a new ultraviolet diode laser: luminescence and p-n junctions in ZnO films.

Hoffman, R.L., Norris, B.J. and Wager, J.F.; ZnO-based transparent thin-film transistors; Applied Physics Letters; Feb. 3, 2003; pp. 733-735; vol. 82, No. 5; American Institute of Physics.

Bockowshi, M.; Growth and Doping of GaN and AlN Single Crystals under High Nitrogen Pressure; Cryst. Res. Technol.; 2001; pp. 771-787; vol. 36; WILEY-VCH Verlag Berlin GmbH, Berlin.

Katayama-Yoshida, H., Sato, K., and Yamamoto, T.; Materials design for new functional semiconductors by *ab initio* electronic structure calculation: Prediction vs. experiment; JSAP International; Jul. 2006; pp. 20-27; No. 6.

Mukai, T., Morita, D., and Nakamura, S.; High-power UV InGaN/AlGaN double-heterostructure LEDs; Journal of Crystal Growth; 1998; pp. 778-781; vol. 189/190; Elsevier Science B.V.

Xing, H., Green, D.S., McCarthy, L., Smorchkova, I.P., Chavarkar, P., et al.; Progress in Gallium Nitride-based Bipolar Transistors.

Piprek, J., and Nakamura, S.; nano-Scale Effects in GaN-based Light-Emitting Diodes; 2004.

Piprek, J.; Simulation of GaN-based Light-Emitting Devices; 2004.

Bunea, G.E., Herzog, W.D., Unlu, M.S., Goldberg, B.B., and Molnar, R.J.; Time-resolved photoluminescence studies of free and donor-bound exciton in GaN grown by hydride vapor phase epitaxy.

Yao, T.; Plasma-Assisted MBE Growth of ZnO; Molecular Beam Epitaxy; pp. 98-105.

Chapter 2 Geometric Structure of Metal Oxides; pp. 55-58.

Chapter 4 Electronic Structure of Non-Transition-Metal-Oxide Surfaces; pp. 143-150.

Ip, K., Khanna, R., Norton, D.P., Pearton, S.J., Ren, F., et al.; Thermal Stability of Tungsten-Based Schottky Contacts to N-Type ZnO.

Look, D.C., Claflin, B., Alivov, Y.I., and Park, S.J.; The future of ZnO light emitters; phys. stat. sol.; 2004.

Itani, Kenya, et al., "Low-Dislocation-Density GaAs Wafers Grown by Vertical Gradient Freeze Process, Suitable for Mass Production of Semiconductor Lasers," Hitachi Cable Review No. 20, Aug. 2001, pp. 35-38.

Pearton, S.J., et al. "Wide Band Gap Ferromagnetic Semiconductors and Oxides," Journal of Applied Physics vol. 93, No. 1, Jan. 1, 2003, pp. 1-13.

Web Page '99 SBIR Phase I . . . Topic 14—Electronic Materials, http://www-ee.eng.buffalo.edu/faculty/paololin/492/semicon.pdf, "Low-Temperature Hydrothermal Growth of Zno for Seminconductor Substrates," Feb. 26, 2004, 2 pages.

Web Page "Semiconductor Photonics", 3 pages.

Renlund, Gary M., et al., "Silicon Oxycarbide Glasses: Part I. Preparation and Chemistry," J. Mater. Res. vol. 6, No. 12, Dec. 1991, pp. 2716-2722.

Renlund, Gary M., et al. "Silicon Oxycarbide Glasses: Part II. Structure and Properties," J. Mater. Res. vol. 6, No. 12, Dec. 1991, pp. 2723-2734.

* cited by examiner

DYNAMIC P-N JUNCTION GROWTH

CROSS REFERENCE TO RELATED APPLICATION

This application claims the benefit of U.S. Provisional Application No. 60/580,454, filed Jun. 17, 2004, which application is incorporated by reference.

BACKGROUND OF THE INVENTION

The present invention provides methods for fabricating p-n junctions and to group II-VI semiconductor devices containing p-n junctions in which the p-n junctions contain concentration profiles for the p-type and n-type dopants that are controllable and independent of a diffusion profile.

P-N junctions have historically been fabricated by diffusion processes in which dopant species diffuse through a material from a region of high concentration to a region of low concentration. Fick's second law explains diffusion under non-steady state conditions:

$$\frac{C_s - C_x}{C_s - C_0} = \text{erf}\left(\frac{x}{2\sqrt{Dt}}\right)$$

where $C_s$=surface concentration of the dopant;
$C_0$=initial concentration of the dopant throughout the material;
$C_x$=concentration of the dopant at distance x from the surface at time t;
x=distance from surface;
D=diffusivity;
t=time;
erf=the "error function" as found in standard tables or graphs.
If $C_0$=0, then $$\frac{C_x}{C_s} = \text{erf}\left(\frac{x}{2\sqrt{Dt}}\right)$$

As D or t increases, the erf expression becomes smaller and $C_x/C_s$ approaches 1. In other words, $C_x$ approaches the surface concentration. The diffusivity D is a function of temperature. As temperature is increased, so does the diffusivity. The concentration profile of the dopant as a result of diffusion, referred to as the diffusion profile, may be determined from the foregoing equations.

Diffusion processes have been effective to prepare p-n junctions in semiconductor materials such as silicon, gallium arsenide, and gallium nitride. These materials are based upon 3 and 4 valent ions, which exist in a crystal lattice that readily permits diffusion. In contrast, zinc oxide and zinc sulfide are based upon divalent ions which exists in a crystal lattice that possesses unique challenges to the fabrication of doped semiconductor materials.

Zinc oxide (ZnO) and zinc sulfide (ZnS) are wide band gap semiconductors with potential for use in electrically excited devices such as light emitting devices (LEDs), laser diodes (LDs), field effect transistors (FETs), photodetectors operating in the ultraviolet and at blue wavelengths of the visible spectrum, and other similar devices. Zinc oxide and zinc sulfide are examples of group II-VI semiconductor compounds.

As used herein, group II-VI semiconductor compounds include group II elements selected from zinc, cadmium, the alkaline earth metals such as beryllium, magnesium calcium, strontium, and barium, and mixtures thereof, and group VI elements selected from oxygen, sulfur, selenium, tellurium, and mixtures thereof. The group II-VI semiconductor compounds may be doped with one or more p-type dopant. Such p-type dopants include, but are not limited to, nitrogen, phosphorus, arsenic, antimony, bismuth, copper, chalcogenides of the foregoing, and mixtures thereof. The group II-VI semiconductor compounds may be doped with one or more n-type dopants. Such n-type dopants include, but are not limited to, ions of Al, Ga, B, H, Yb and other rare earth elements, Y, Sc, and mixtures thereof.

Zinc oxide has several properties which make it an attractive for use as a group II-VI semiconductor. For instance, ZnO has a large exciton binding energy, which suggests that ZnO-based lasers should have efficient optical emission and detection. Zinc oxide drift mobility saturates at high fields and high values, which may lead to higher frequency device performance. The cost and ease of manufacture of zinc oxide is attractive when compared to other common semiconductor materials. Zinc oxide has excellent radiation-resistance (2 MeV at $1.2 \times 10^{17}$ electrons/cm$^2$), which is desirable for radiation hardened electronics. Zinc oxide has high thermal conductivity (0.54 W/cm·K). Zinc oxide has strong two-photon absorption with high damage thresholds, rendering it ideal for optical power limiting devices. Zinc oxide forms two stable polytypes: wurtzite and zincblende; however, polytypism is not as prevalent as with GaN, AlN, and SiC.

N-type zinc oxide semiconductor materials are known and relatively easy to prepare, such as ZnO doped with aluminum, gallium, or other known n-type dopants. P-type zinc oxide semiconductor materials are theoretically possible, but have been difficult to prepare. D. C. Look et al., "The Future of ZnO Light Emitters," Phys. Stat. Sol., 2004, summarize data on p-type ZnO samples reported in the literature. The best reported ZnO samples have resistivity values of 0.5 ohm•cm (N/Ga dopants) and 0.6 ohm•cm (P dopant). Many of the reported p-type zinc oxide samples tend to be light, heat, oxygen, and moisture sensitive. Some convert to n-type material over time. Their stability has been questioned. Some of the more-stable p-type zinc oxide materials reported in the literature are prepared using complex and expensive fabrication processes, such as molecular beam epitaxy. No commercially viable p-type zinc oxide semiconductor materials are currently known.

Without being bound by theory, it is presently believed one possible explanation for the lack of p-type zinc oxide materials is because high temperature diffusion processes or other fabrication methods inhibit formation of desirable p-type zinc oxide compounds.

As mentioned above, temperature determines the effective limits for diffusion to be applicable in certain semiconductor systems. At low temperature the process is limited by slow diffusion, and when the temperature becomes sufficiently high for diffusion to occur, chemical reaction between the p-type dopant and oxygen forms stable gaseous species that make the p-type zinc oxide semiconductor structure unstable. Therefore, diffusion processes are not economically feasible for forming p-n junctions. Instead, a dynamic growth process should be used to fabricate p-n junctions.

SUMMARY OF THE INVENTION

The present invention is drawn to methods for fabricating p-n junctions and to group II-VI semiconductor devices containing p-n junctions in which the p-n junctions contain concentration profiles for the p-type and n-type dopants that are dynamically controllable and independent of a diffusion profile.

The solid state devices will typically include a p-type group II-VI semiconductor material, an n-type group II-VI semiconductor material, and a p-n junction disposed between the p-type and n-type semiconductor materials. The p-n junction contains a concentration profile of p-type dopant that is predetermined and independent of a p-type dopant diffusion profile. Likewise, the p-n junction may contain a concentration profile of n-type dopant that is predetermined and independent of an n-type dopant diffusion profile.

For example, the concentration profiles of the p-type dopant and n-type dopant in the p-n junction may be substantially linear, may follow a predetermined curve, may be substantially equal or parallel, or take any other predetermined shape or configuration or combination thereof.

The present invention includes a variety of solid state devices containing a dynamically controlled p-n junction. Such devices include, but are not limited to electrically excited devices such as light emitting devices (LEDs), laser diodes (LDs), transistors, photodetectors, and other similar devices.

The present invention further includes solid state devices that include a concentration profile of either a p-type dopant or an n-type dopant having a concentration profile that is predetermined and independent of the p-type or n-type dopant diffusion profile. One example of such devices includes field effect transistors (FET). The ability to control the dopant concentration, independent of diffusion, may provide control of switching speeds, turn-on and turn-off times, and the level of device conductivity.

The methods for fabricating the p-n junctions within the scope of the present invention provide independent control of the concentration profiles of the n-type dopant and p-type dopant in the p-n junction. The fabrication methods include chemical deposition processes that prepare single crystal semiconductor material doped with a p-type or n-type dopant. The fabrication methods independently control the deposition rate for p-type semiconductor material and n-type semiconductor material. In many cases, the p-n junction is fabricated by simultaneously depositing p-type and n-type semiconductor material in a manner such that the concentration of the p-type and n-type dopants is controlled during the deposition process.

As used herein, a single crystal semiconductor material possesses a single predominant reflection on an X-ray diffraction pattern. Polycrystalline materials will possess multiple reflection peaks on an X-ray diffraction pattern. Persons skilled in the art will appreciate that a perfect single crystal, defect free, does not exist. There will always be some minor crystal defects present. As used herein, a single predominant reflection peak will possess at least 95% of the integrated area of the X-ray diffraction pattern, and more preferably greater than 99%.

In one presently preferred method 800 illustrated in FIG. 8, the semiconductor p-n junction is grown with a crystal growth process that allows simultaneous control and variation of p-type and n-type dopant concentration during the crystal growth process, 802. As the p-n junction is grown, the p-type dopant concentration is dynamically controlled such that the p-type dopant concentration conforms to a predetermined concentration profile within the p-n junction, 804. Similarly, the n-type dopant concentration may be dynamically controlled such that the n-type dopant concentration conforms to a predetermined concentration profile within the p-n junction, 806.

Various chemical deposition processes may be used as the crystal growth process 802 within the scope of the present invention including, but not limited to, RF sputtering, MBE (molecular beam epitaxy), CVD (chemical vapor deposition), MOCVD (metal organic chemical vapor deposition), and other thin film crystal growth techniques.

BRIEF DESCRIPTION OF THE SEVERAL VIEWS OF THE DRAWINGS

A more particular description of the invention briefly described above will be rendered by reference to specific embodiments thereof which are illustrated in the appended drawings. These drawings depict only typical embodiments of the invention and are not therefore to be considered to be limiting of its scope. The invention will be described and explained with additional specificity and detail through the use of the accompanying drawings in which.

DETAILED DESCRIPTION OF THE INVENTION

Figure 1:
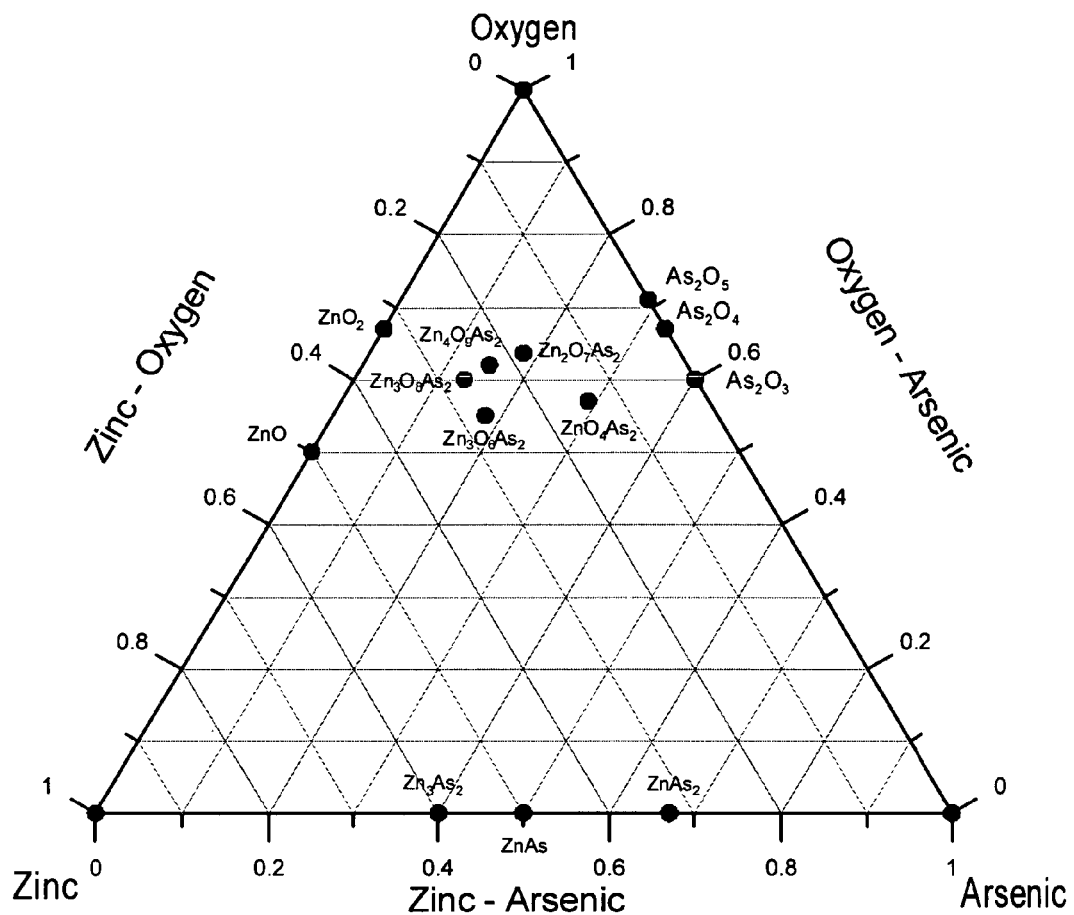
FIG. 1 is a zinc-oxygen-arsenic ternary diagram.
Figure 2:
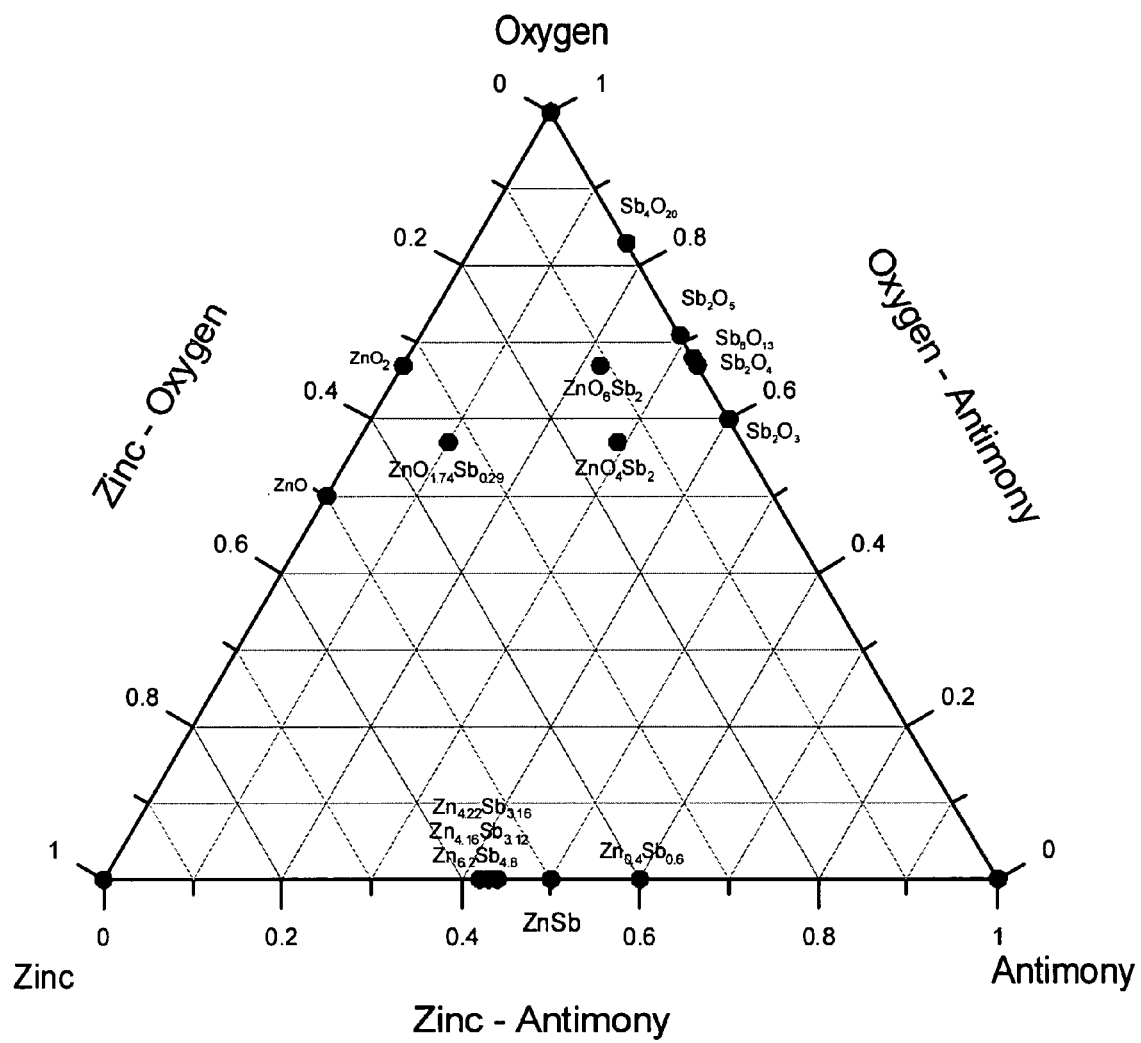
FIG. 2 is a zinc-oxygen-antimony ternary diagram.
Figure 3:
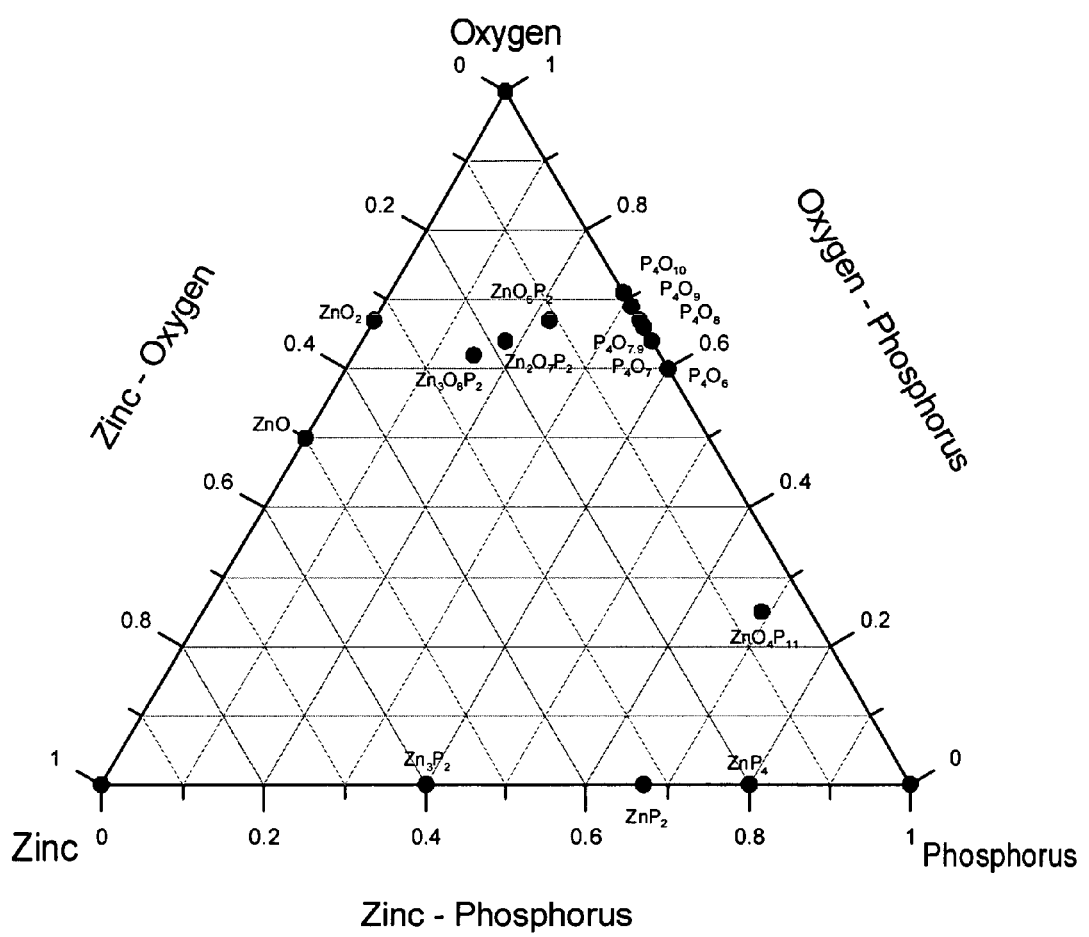
FIG. 3 is a zinc-oxygen-phosphorus ternary diagram.
Figure 4:
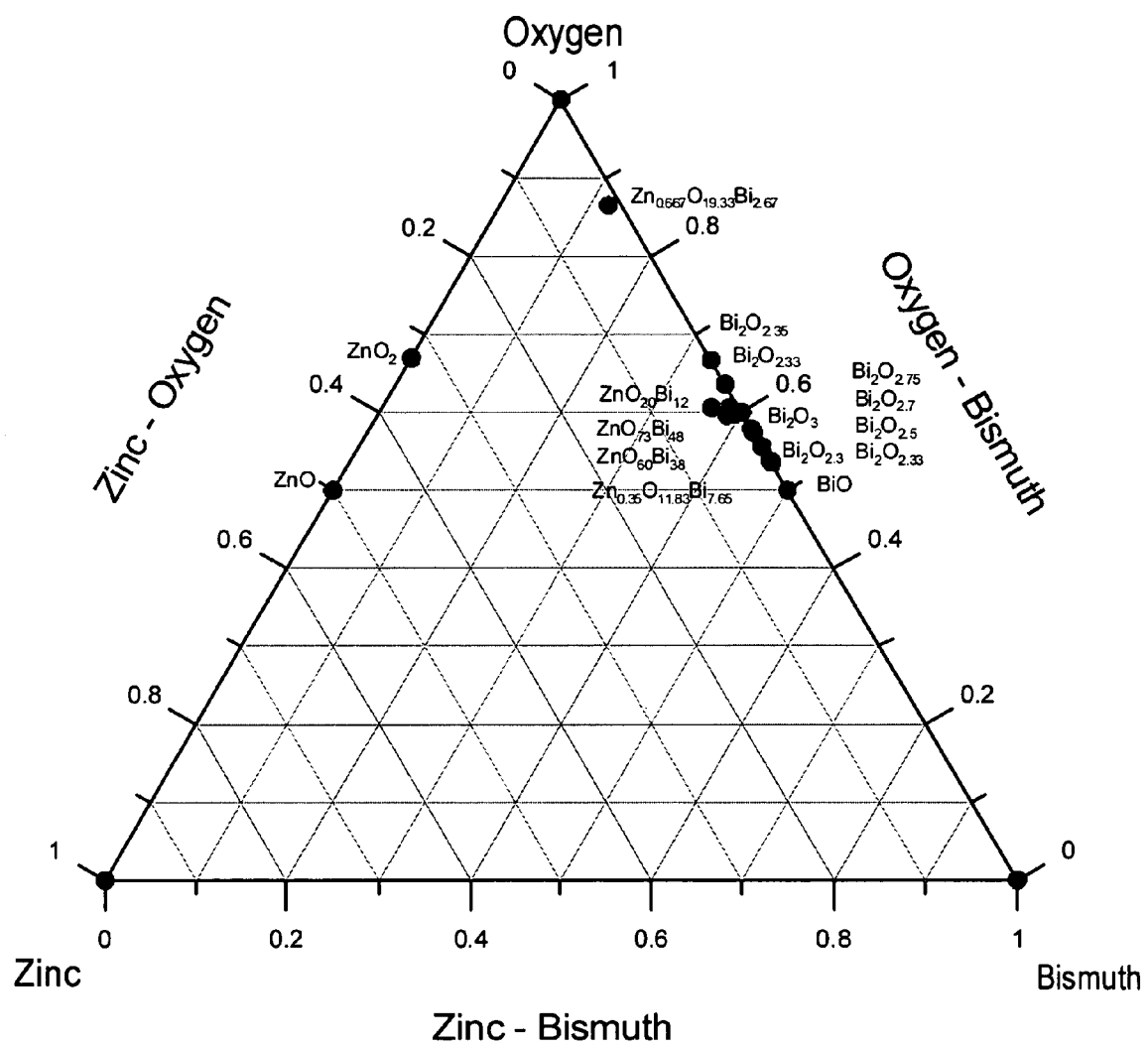
FIG. 4 is a zinc-oxygen-bismuth ternary diagram.
Figure 5:
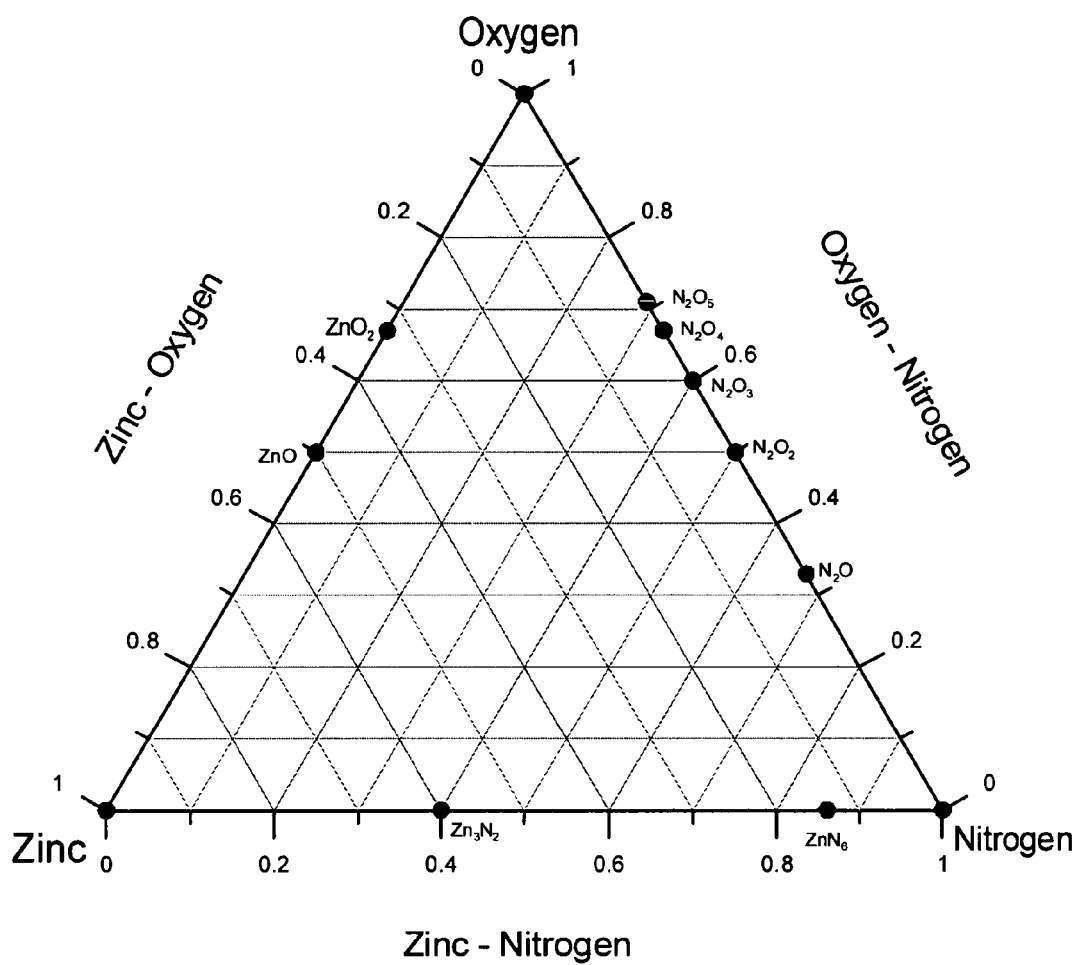
FIG. 5 shows a zinc-oxygen-nitrogen ternary diagram.

The present invention is drawn to fabricating p-n junctions and to semiconductor devices containing p-n junctions in which the p-n junctions contain a p-type dopant concentration profile and a n-type dopant concentration profile that are predetermined, controllable and independent of a diffusion profile. Dynamic growth processes are used in accordance with the present invention to prepare a p-n junction having a p-type and n-type dopant concentration profile that can vary as a function of distance and take on any desired concentration profile.

As used herein, dynamic growth processes include processes for growing or fabricating a layer of group II-VI semiconductor material in which the concentration profile of a p-type dopant and the concentration profile of an n-type dopant can be independently controlled. For example, the dopant concentration profiles may be linear, square, curved, or any combination or variation thereof.

As an example, if sputtering is used to fabricate the p-n junction, preferably two sputtering heads are utilized, one which sputters an n-type dopant and another which sputters a p-type dopant. The concentration of each dopant can be independently controlled. In a typical RF magnetron sputtering process, a substrate is placed in a low-pressure chamber. The magnetron sputtering head is driven by an RF power source which generates a plasma and ionization of the gas or gases (e.g., argon and selected dopants). For RF sputtering, a high-frequency generator is used generating electromagnetic power in the MHz-Region (typically about 13.56 MHz).

Argon ions bombard the target releasing ions from the target which are liberated and accelerated towards the substrate. Additional atoms in the plasma may also be deposited onto the substrate. In this case, the sputtering system may be modified to use two sputter heads in combination with two targets to independently control the concentration of the dopants. Alternatively, other means may be used to control the dopant concentration, such as independently controllable heating baskets to vaporize the dopants and control the gaseous dopant concentration during the sputtering process.

Likewise, if a metal organic chemical vapor deposition (MOCVD) process is used to fabricate the p-n junction separate nozzles may be used to deposit the n-type and p-type dopants. In a typical MOCVD process, organic compounds containing atoms which ultimately will form the doped semiconductor material are sprayed onto a spinning substrate. The organic compounds may or may not be dissolved in a solvent. In the case of zinc oxide, the organic compounds are designed to have the dopant ion, such as arsenic, bound only to the zinc. It is preferred to use organic compounds which place the dopant ion, such as arsenic, apart from oxygen so that reaction with oxygen during pyrolysis is inhibited. In this manner, the orientation of the zinc, oxygen, and dopant ions are maintained by the organic compound until it is pyrolyzed and removed, leaving behind the desired zinc oxide structure. It will be appreciated by those skilled in the art that other dopant compounds besides arsenic may also be used, including p-type and n-type dopants.

The MOCVD process occurs in a partial vacuum. The substrate often spins at a rate of about 50-100 rpm, and as high as 600 rpm. The organic compounds are forced through heated nozzles. The nozzles heat the liquid to the vapor point, and the vaporized compounds mix in a mixing chamber. Other compounds may be optionally added in the mixing chamber, such as nitrogen, ammonia, or dopants. The substrate surface is heated to a temperature of about 300° C. to 700° C. to cause pyrolysis. The atmosphere during pyrolysis is preferably an inert atmosphere or slightly reducing. The atmosphere should not be so reducing that oxygen is removed from zinc. There must be sufficient oxygen present to oxidize the carbon in the polymer backbone to CO or $CO_2$, but not enough oxygen to oxidize the p-type dopant, such as arsenic. The oxygen partial pressure may be controlled with hydrogen bubbling through a temperature controlled water bath. The organic compounds must be pyrolyzed in order to leave behind the desired semiconductor composition. In many MOCVD processes the organic constituents are engineered to be chemically bound into the same organic compound. In the present case, each dopant constituent is preferably sprayed onto the substrate through separate nozzles.

Other dynamic growth processes may be used to independently control the p-n junction concentration profile. These processes include, but are not limited to laser ablation, molecular beam epitaxy, and atomic layered devices (ALD).

FIGS. 1-5 show zinc oxide ternary diagrams with selected p-type dopants, arsenic, antimony, phosphorous, bismuth, and nitrogen. These ternary diagrams share some common characteristics. For example, high stability binary compounds are formed along the Zn—O axis, along the Zn-dopant axis, and along the O-dopant axis. Compounds along the O-dopant axis are volatile. Ternary compounds are stable, but not volatile.

With reference to p-type zinc oxide, the p-type dopant may substitute for oxygen or substitute for zinc. If the dopant replaces oxygen, then it would be an anion, and if the dopant replaces zinc, it would be a cation. Referring to arsenic as the p-type dopant, there are two substitutional defects that are considered as the most probable ($As_O$) and ($As_{Zn}$). The notation "$As_O$" refers to an arsenic atom replacing an oxygen atom in the ZnO lattice. The notation "$As_{Zn}$" refers to an arsenic atom replacing a zinc atom. It is believed that both $As_O$ and $As_{Zn}$ result in the formation of complex crystal lattice coordination compounds that may include the formation of zinc vacancies on zinc sites, shown by the notation "$V_{Zn}$".

The dopant ion, once in the zinc oxide structure is surprisingly stable and does not move through diffusion. Indeed, if diffusion were to occur, the structure would not be stable. Without being bound by theory, it is presently believed this is due to a bonding restriction that allows the p-type zinc oxide to form. In the case of arsenic as the p-type dopant, there are no, or a limited number, of As—O bonds in the p-type arsenic-doped zinc oxide crystal lattice. If As—O bonds were to form, a low stability As—O compound would form that would render the zinc oxide structure less stable. Bonding restrictions of this kind are known in connection with carbon doping of silica. J. Mater. Res., Vol. 6, No. 12, December 1991.

While the foregoing discussion relates to arsenic doped zinc oxide, it is believed the bonding restrictions seen with As—O involve other group 5 oxides, and also include group 5 chalcogenides. Moreover, the invention includes the use of other p-type dopants, including, but not limited to nitrogen, phosphorus, antimony, and bismuth.

The high stability of the zinc oxide semiconductor devices allows them to be operated at higher temperatures, compared to conventional group III/V devices. Because the dopants are locked into the zinc oxide crystal structure, semiconductor devices containing engineered p-n junctions and engineered dopant concentration profiles provide improved stability at any given temperature. Such devices may survive high temperature excursion of 100° C. (during processing or use). This is particularly useful for field effect transistors and power devices.

Figure 7A:
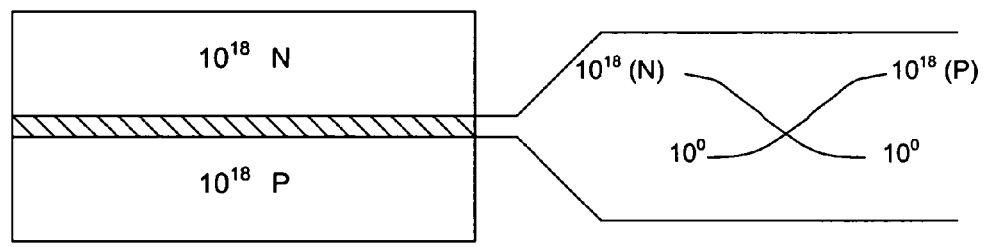
FIGS. 7A-7C are schematic representations of p-n junctions and possible p-type and n-type dopant concentration profiles within the p-n junction.
Figure 7B:
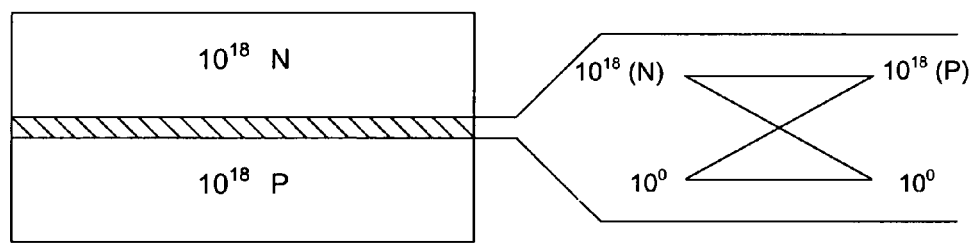
Figure 7C:
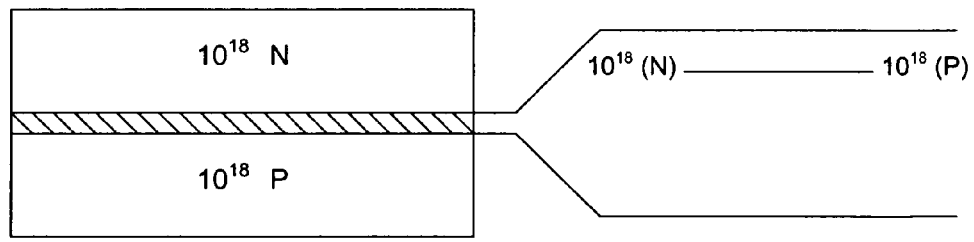
Figure 8:
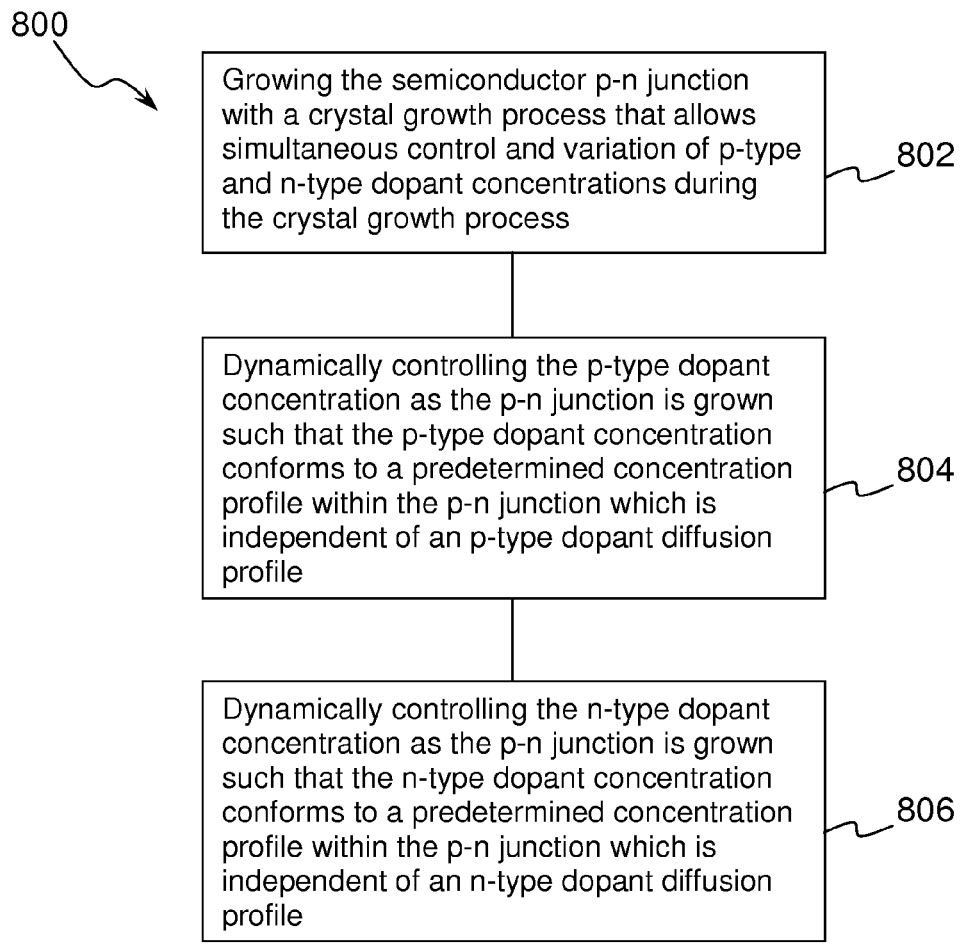
FIG. 8 is a flow chart for a method of fabricating a semiconductor p-n junction configured to be disposed between a layer of semiconductor doped with a p-type dopant and a layer of semiconductor doped with an n-type dopant.

FIGS. 7A-7C are schematic representations of p-n junctions and possible p-type and n-type dopant concentration profiles within the p-n junction. As mentioned above, the use of dynamic growth processes permits one to control the dopant concentration profiles. FIGS. 7A-7C are a schematic representation of a p-n junction with a lower p-type region, and upper n-type region, and a middle p-n junction shown with cross-hatching. The p-type dopant is designated with the symbol "P" and the n-type dopant is designated with the symbol "N". The p-type dopant concentration is about $10^{18}$ atoms/cm$^3$, and the n-type dopant concentration is about $10^{18}$ atoms/cm$^3$.

On the right of FIGS. 7A-7C is a representation of possible concentration profiles for the p-type and n-type dopants. In FIG. 7A, the dopant concentration profiles follow curves similar to what one might obtain from diffusion of the dopants from a region of high concentration to a region of low concentration. In FIG. 7B, the dopant concentration profiles are linear. In FIG. 7C, the p-n junction contains concentrations of both the p-type and n-type dopants at the maximum level of the respective p-type and n-type regions. A distinct advantage of dynamic p-n junction growth is the ability to control the dopant concentration profile within the p-n region. It is believed that dopant concentration profile affects p-n junction device performance. In accordance with the present invention, the concentration profile can be controlled and optimized for the desired performance.

EXAMPLES

The following examples are given to illustrate various embodiments within the scope of the present invention. These are given by way of example only, and it is to be understood that the following examples are not comprehensive or exhaustive of the many embodiments within the scope of the present invention.

Prior pending U.S. patent application Ser. Nos. 10/849,332, 10/849,345, 10/849,347, and 10/849,348, filed May 19, 2004, are incorporated by reference. These applications disclose methods and apparatus for the fabrication of p-type group II-VI semiconductors, p-type group II-VI semiconductor compounds, group II-VI semiconductor devices, and crystal growth substrates. The inventions disclosed in these prior patent applications may be adapted for use within the scope of the present invention.

Figure 6:
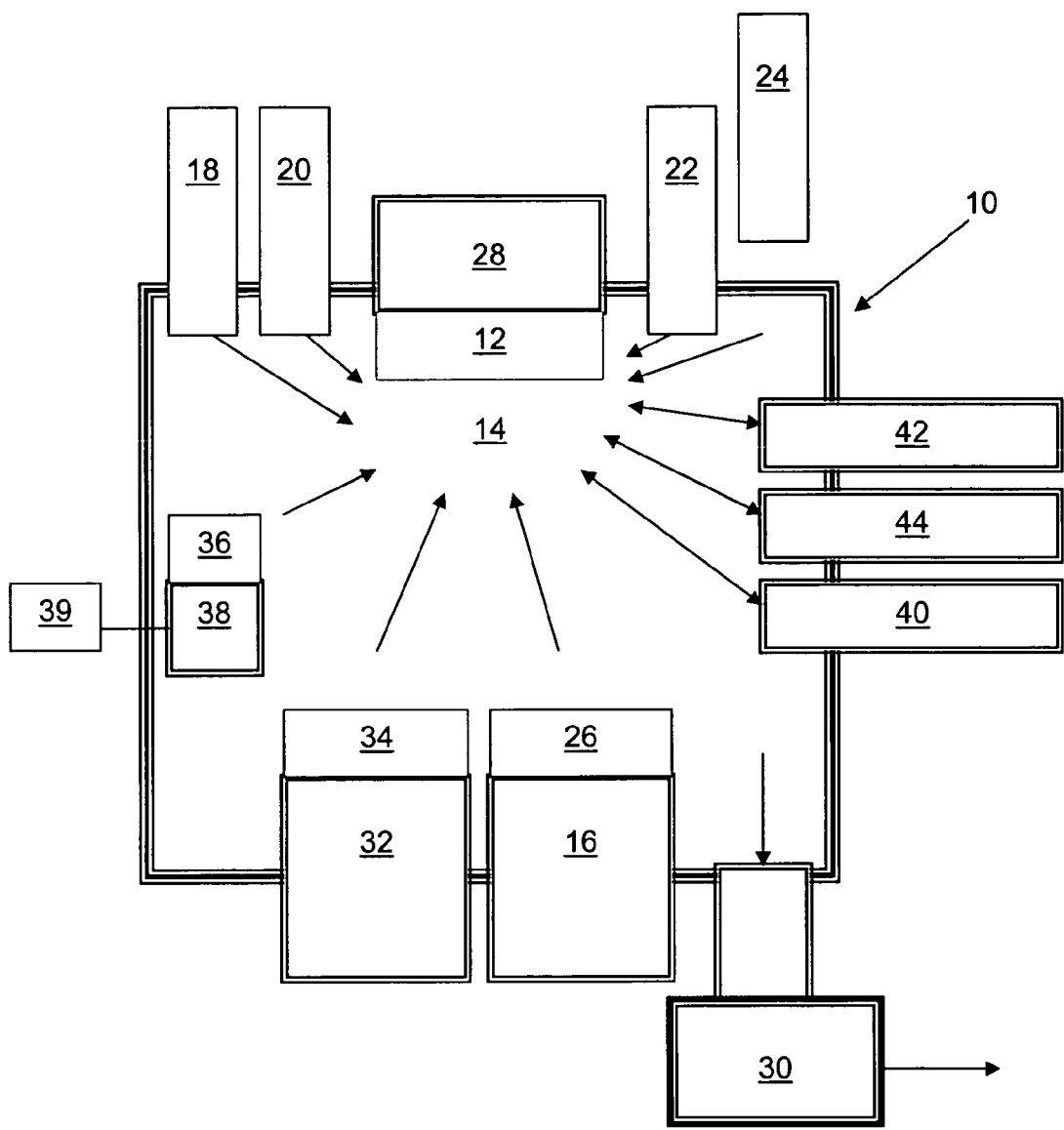
FIG. 6 is a schematic representation of a sputtering system that may be used to grow p-n junctions within the scope of the present invention.

Many of the following Examples involve sputtering. FIG. 6 illustrates a schematic representation of a sputtering system 10 that may be used in some of the following examples. In RF sputtering, a substrate 12 is placed in a low-pressure chamber 14. A magnetron sputtering head 16 is driven by an RF power source (not shown) which generates a plasma and ionization of the sputtering gas or gases between the electrodes. The sputtering gas typically includes an inert sputtering gas, which may include, but is not limited to, argon, krypton, xenon, neon, and helium. The sputtering gas may optionally include one or more selected dopants. A plurality of gas sources 18, 20, 22, and 24 may provide $N_2$, $H_2$, Ar, $O_2$, or other desired gases. For RF sputtering, a high-frequency generator is used generating electromagnetic power in the MHz-Region. Argon ions bombard the target 26, releasing ions from the target which are accelerated towards the substrate. Additional atoms in the plasma may also be deposited onto the substrate, such as dopant atoms.

In the sputtering system of FIG. 6, the substrate 12 is secured in place by a heated substrate fixture 28. The temperature of the heated substrate fixture 28 may be measured and reported as an approximation of the substrate temperature. The sputtering chamber 14 is constantly evacuated with a vacuum pump system 30. The sputtering atmosphere includes an inert sputtering gas mentioned above, and may optionally include other gases which are provided by the respective gas source 18, 20, 22, and 24. The gas pressures reported below, such as 10 mtorr, represent the gas pressure of the respective gas as it is introduced into the sputtering chamber 14.

In the embodiment illustrated in FIG. 6, a second magnetron sputtering head 32 is driven by an RF power source (not shown). Argon ions from the inert sputtering gas bombard the target 34, releasing ions from the target which are accelerated towards the substrate. Having two independently controllable sputtering heads allows greater control over dopant concentration of the material deposited on substrate 12.

In some embodiments, volatile materials 36, which may include p-type or n-type dopants, may be evaporated in a heated basket, illustrated as the heated evaporator 38. The temperature of the heated basket is adjusted by controller 39 to control the evaporation rate and resulting concentration of the volatile material 36. The system includes online pressure measurement 40. It also includes thickness measurement capability 42. The system optionally includes an online mass spectrometer 44 which may measure the gas content and accurately determine the partial pressure of the sputtering atmosphere.

Unless specifically noted, the following are common conditions for the sputtering described in the Examples:

1. The distance between the sputtering target and the deposition substrate is about 1.5 inches.
2. Radio Frequency is 13.56 MHz. It will be appreciated by those skilled in the art that much lower and much higher frequencies may be used in RF sputtering systems. However, for practical considerations and FCC regulations, the radio frequency is 13.56 MHz.
3. The atmosphere is maintained by using a continuous vacuum, and pressures were controlled by addition of indicated gases. Some residual atmospheric oxygen or moisture adsorbs on the metal surfaces within the sputtering chamber. Therefore, oxygen out-gases during the sputtering process at the operating temperature and pressure.
4. The sputtering time is typically about 10 minutes, but samples may be sputtered for longer time periods, such as an hour, and samples may be sputtered for shorter periods, such as one minute. The sputtering time is selected to produce a film thickness of about one micron. It will be appreciated that several factors affect the film thickness, including, but not limited to, sputtering time, power, temperature, concentration of dopants, and evaporation of constituents of the sputtered thin film.
5. Each RF magnetron sputtering head is preferably one inch, used with water cooling.

Various Examples of sputtering ZnO and ZnS with arsenic, antimony, and other dopants are set forth in U.S. application Ser. Nos. 10/849,347, 10/849,345, and 10/849,348, filed May 19, 2004, which applications are incorporated by reference.

Example 1

Dynamic Sputtering of a P-N Junction.

A thin film of p-type zinc oxide is deposited onto a self supporting substrate by RF sputtering using a sputtering system having two sputtering heads. Either fused silica or silicon wafer may be used as the self supporting substrate. The sputtering target composition associated with the first sputtering head is ZnO (0.99-0.95 moles)+As (0.01-0.05 moles). The preferred target composition is ZnO (0.975 moles)+As (0.025 moles). The substrate temperature is between 350 and 550° C. The preferred temperature is about 400° C. The RF power is between 20 and 120 watts. The preferred power is 90 watts. The sputtering atmosphere includes argon at a gas pressure of about 4 to 20 mtorr. The preferred sputtering atmosphere pressure is about 9 mtorr argon. The thin film of p-type zinc oxide has a thickness of about 960 µm. It is deposited in about 600 seconds, resulting in a deposition rate of about 1.6 nm/second.

The sputtering system includes a second sputtering head. The sputtering target composition associated with the second sputtering head is ZnO (0.99-0.95 moles)+$Ga_2O_3$ (0.01-0.05 moles). The preferred target composition is ZnO (99.925 mole %) and $Ga_2O_3$ (0.075 mole %) that had been mixed, sintered, and annealed at about 1100° C. The second sputtering head is operated at the same RF power as the first sputtering head.

The p-n junction is fabricated over a 40 second transition period. The transition period may easily range from about 20 seconds to about 2 minutes. The p-n junction has a thickness of about 65 nm, but it can range from about 20 nm to about 100 nm or more. A thicker p-n junction may be fabricated over a longer sputtering time period or with an increased deposition rate. During the transition period, the power associated with the first sputtering head is decreased such that the p-type zinc oxide deposition rate is reduced to zero. Hence, over the 40 second period, the p-type zinc oxide deposition rate is reduced at a rate of about 0.04 nm/second. During the same 40 second transition period, the power to the second sputtering head is increased such that the n-type zinc oxide deposition rate is raised from a deposition rate of about zero nm/second to a rate of about 1.6 nm/second. Thus, the n-type zinc oxide deposition is raised at a rate of about 0.04 nm/second.

Following this 40 second transition period, the second sputtering head is operated for a period of about 600 seconds, which results in the deposition of a thin film of n-type zinc oxide having a thickness of about 960 nm.

It will be appreciated that the p-n junction fabricated in accordance with this example will have p-type and n-type dopant concentration profiles that are approximately linear. The concentration profiles can be controlled by controlling the deposition rates of the p-type and n-type semiconductor materials. The dopant concentrations can also be controlled by controlling the gaseous partial pressures of dopants. It will also be appreciated by those skilled in the art that the sputtering conditions and dopants can be varied as disclosed the patent applications identified above. Similarly, it will be appreciated that the order of process steps described above may be reversed such that the layer of n-type semiconductor is deposited first, followed by the transition period in which the p-n junction is formed, followed by deposition of the layer of p-type semiconductor material.

Example 2

Dynamic MOCVD of a P-N Junction.

A p-n junction may be fabricated in a manner similar to Example 1, above, except that a MOCVD process is used to fabricate the semiconductor layers instead of sputtering. The MOCVD process utilizes a plurality of spray nozzles which may be independently controlled to control dopant concentrations and deposition rates.

Example 3

Dynamic MBE of a P-N Junction.

A p-n junction may be fabricated in a manner similar to Example 1, above, except that a molecular beam epitaxy (MBE) process is used to fabricate the semiconductor layers instead of sputtering. The MBE process utilizes a plurality of cells which contain chemicals or precursors which may be independently controlled to control dopant concentrations and deposition rates.

Example 4

Dynamic Laser Ablation of a P-N Junction.

A p-n junction may be fabricated in a manner similar to Example 1, above, except that a laser ablation process is used to fabricate the semiconductor layers instead of sputtering. The laser ablation process utilizes a plurality of lasers which may be independently controlled to control dopant concentrations and deposition rates. Commercially available lasers, such as diode lasers, $CO_2$, and excimer lasers may be used. Higher power lasers may be useful to evaporate zinc oxide directly rather than zinc metal. It is observed that more accurate deposition of zinc oxide thin films is achieved by evaporating zinc oxide than by evaporating zinc metal and controlling the required oxygen partial pressure to form zinc oxide. Moreover, it is desirable to maintain the oxygen partial pressure at a low level to prevent undesirable reaction with the p-type and n-type dopants.

Single or multiple quantum well (MQW) heterostructures may be fabricated to render the p-n junction more efficient. A single quantum well is made of two alternating semiconductor materials. One layer is a barrier layer defined by a higher band gap than the second layer. The second layer's band gap defines the bottom of the quantum well. For example, MgO may be alloyed with ZnO to form the barrier layer, and the undoped ZnO will define the bottom of the well. This produces a more efficient device and raises the band edge. Conversely, CdO may be alloyed with ZnO to define the bottom layer of the quantum well, and the undoped ZnO defines the barrier layer. This produces a more efficient device and lowers the band edge.

An additional advantage of a quantum well is that the layers can be mechanically strained to raise or lower the band edge. Mechanical strain may exist if the two layers have slightly different crystal lattice constants. For most zinc oxide materials the band edge is around 390 nm, but some of the zinc oxide semiconductor materials fabricated in accordance with the present invention had a band edge of about 370 nm.

The number of quantum wells may vary. Good results may be obtained with just one quantum well. Typically the number of quantum wells may range from about 1 to 10, and more preferably from about 3 to 7 quantum wells. The total thickness of the quantum well alternating layers must in the vicinity of, or less than, the electron de Broglie wavelength (100 Å). These heterostructures may be fabricated through a chemical deposition process, including but not limited to those described above, such as sputtering, MBE, CVD, MOCVD, etc.

For example, one possible MQW configuration for use in connection with zinc oxide semiconductor structure may include alternating layers of ZnO (20 Å-100 Å) and $Cd_xZn_{1-x}O$ (10 Å-25 Å). The cadmium content may be varied. The amount of cadmium in the cadmium zinc oxide alloy may vary depending on the desired shifting of the band gap. In one illustrative embodiment, the cadmium content may range from about 1 to 20 mole %, and more typically about 10 mole %. The cadmium zinc oxide alloy may be replaced with a magnesium zinc oxide alloy of the general formula $Mg_xZn_{1-x}O$.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

The invention claimed is:

1. A method of fabricating a semiconductor p-n junction configured to be disposed between a layer of semiconductor doped with a p-type dopant and a layer of semiconductor doped with an n-type dopant comprising the steps of:
   growing the semiconductor p-n junction with a crystal growth process that allows simultaneous control and variation of p-type and n-type dopant concentrations during the crystal growth process;
   dynamically controlling the p-type dopant concentration as the p-n junction is grown such that the p-type dopant concentration conforms to a predetermined concentration profile within the p-n junction which is independent of an p-type dopant diffusion profile; and
   dynamically controlling the n-type dopant concentration as the p-n junction is grown such that the n-type dopant concentration conforms to a predetermined concentration profile within the p-n junction which is independent of an n-type dopant diffusion profile.

2. A method of fabricating a semiconductor p-n junction according to claim 1, wherein the concentration profile of the p-type dopant in the p-n junction is substantially linear.

3. A method of fabricating a semiconductor p-n junction according to claim 1, wherein the concentration profile of the n-type dopant in the p-n junction is substantially linear.

4. A method of fabricating a semiconductor p-n junction according to claim 1, wherein the concentration profile of the p-type dopant in the p-n junction follows a predetermined curve.

5. A method of fabricating a semiconductor p-n junction according to claim 1, wherein the concentration profile of the n-type dopant in the p-n junction follows a predetermined curve.

6. A method of fabricating a semiconductor p-n junction according to claim 1, wherein the p-n junction is fabricated by a RF sputtering crystal growth process.

7. A method of fabricating a semiconductor p-n junction according to claim 1, wherein the p-n junction is fabricated by a MBE (molecular beam epitaxy) crystal growth process.

8. A method of fabricating a semiconductor p-n junction according to claim 1, wherein the p-n junction is fabricated by a CVD (chemical vapor deposition) crystal growth process.

9. A method of fabricating a semiconductor p-n junction according to claim 1, wherein the p-n junction is fabricated by a MOCVD (metal organic chemical vapor deposition) crystal growth process.

* * * * *